United States Patent
Chow et al.

(10) Patent No.: US 11,430,042 B2
(45) Date of Patent: Aug. 30, 2022

(54) METHODS AND SYSTEMS FOR PROVIDING A VEHICLE RECOMMENDATION

(71) Applicant: Capital One Services, LLC, McLean, VA (US)

(72) Inventors: Chih-Hsiang Chow, Plano, TX (US); Steven Dang, Plano, TX (US); Elizabeth Furlan, Plano, TX (US)

(73) Assignee: Capital One Services, LLC, McLean, VA (US)

( * ) Notice: Subject to any disclaimer, the term of this patent is extended or adjusted under 35 U.S.C. 154(b) by 135 days.

(21) Appl. No.: 16/862,777

(22) Filed: Apr. 30, 2020

(65) Prior Publication Data

US 2021/0342913 A1 Nov. 4, 2021

(51) Int. Cl.
*G06F 30/12* (2020.01)
*G06N 3/08* (2006.01)
(Continued)

(52) U.S. Cl.
CPC ....... *G06Q 30/0631* (2013.01); *B60R 16/037* (2013.01); *G06F 16/9535* (2019.01); *G06F 30/12* (2020.01); *G06F 30/15* (2020.01); *G06N 3/08* (2013.01); *G06N 20/00* (2019.01); *G06Q 30/0282* (2013.01); *G06Q 30/0621* (2013.01); *G06Q 30/0627* (2013.01); *G06Q 30/0629* (2013.01); *G06Q 30/0643* (2013.01); *G06T 19/20* (2013.01); *G06T 2200/24* (2013.01);
(Continued)

(58) Field of Classification Search
CPC ........... G06Q 30/0631; G06Q 30/0282; G06Q 30/0621; G06Q 30/0627; G06Q 30/0629; G06Q 30/0643; G06N 20/00; G06N 3/08; G06F 16/9535; G06F 30/12; G06F 30/15; B60R 16/037; G06T 19/20; G06T 2200/24; G06T 2200/2012; G06T 2200/2021; G06T 2200/2024
See application file for complete search history.

(56) References Cited

U.S. PATENT DOCUMENTS 8,686,992 B1 * 4/2014 Makadia ............... G06F 16/532
345/419
9,632,502 B1 4/2017 Levinson et al.
(Continued)

*Primary Examiner* — Andrew T Chiusano
(74) *Attorney, Agent, or Firm* — Bookoff McAndrews, PLLC

(57) ABSTRACT

A computer-implemented method for providing a vehicle recommendation may include obtaining characteristic data of a user-defined vehicle based on one or more interactive activities of a user with a first three-dimensional model of a model vehicle; generating a second three-dimensional model of the user-defined vehicle based on the first three-dimensional model and the characteristic data; obtaining one or more images of the second three-dimensional model; generating a selection of one or more pre-stored vehicles based on a comparison between the one or more images of the second three-dimensional model and pre-stored image data of the one or more pre-stored vehicles other than the user-defined vehicle; obtaining user feedback data based on the selection of the one or more pre-stored vehicles; generating the vehicle recommendation for the user based on the user feedback data; and transmitting, to a device associated with the user, a notification indicative of the vehicle recommendation.

20 Claims, 5 Drawing Sheets

(51) Int. Cl.
*G06F 16/9535* (2019.01)
*G06Q 30/06* (2012.01)
*G06Q 30/02* (2012.01)
*G06F 30/15* (2020.01)
*G06N 20/00* (2019.01)
*G06T 19/20* (2011.01)
*B60R 16/037* (2006.01)

(52) U.S. Cl.
CPC ............... *G06T 2219/2012* (2013.01); *G06T 2219/2021* (2013.01); *G06T 2219/2024* (2013.01)

(56) References Cited

U.S. PATENT DOCUMENTS

| | | | |
|---|---|---|---|
| 9,977,430 | B2 | 5/2018 | Shalev-Shwartz et al. |
| 2011/0137758 | A1* | 6/2011 | Bienias ............... G06Q 30/0643 705/27.2 |
| 2016/0364783 | A1* | 12/2016 | Ramanuja ........... G06Q 30/0631 |
| 2017/0103584 | A1* | 4/2017 | Vats ........................ G06T 19/20 |
| 2018/0046649 | A1* | 2/2018 | Dal Mutto .............. G06F 16/41 |
| 2018/0260793 | A1 | 9/2018 | Li et al. |
| 2018/0314890 | A1* | 11/2018 | Nogami ................ G06F 16/434 |
| 2020/0050736 | A1* | 2/2020 | Shayani ................. G06F 30/17 |

\* cited by examiner

METHODS AND SYSTEMS FOR PROVIDING A VEHICLE RECOMMENDATION

TECHNICAL FIELD

Various embodiments of the present disclosure relate generally to providing a recommendation to a user, and, more particularly, to providing a vehicle recommendation to a user.

BACKGROUND

Many vehicle purchasing tools provide little in the way of convenience for the customer. When researching vehicles, a would-be vehicle purchaser is often limited to the use of rigid predefined search filters of the tool which may fail to encompass preferences of the would-be vehicle purchaser. Accordingly, a need exists for increasingly robust search tools enabling a variety of users to effectively identify products for purchase.

The present disclosure is directed to overcoming the above-referenced challenge. The background description provided herein is for the purpose of generally presenting the context of the disclosure. Unless otherwise indicated herein, the materials described in this section are not prior art to the claims in this application and are not admitted to be prior art, or suggestions of the prior art, by inclusion in this section.

SUMMARY OF THE DISCLOSURE

According to certain aspects of the disclosure, methods and systems are disclosed for providing a vehicle recommendation to a user.

In an aspect, a computer-implemented method for providing a vehicle recommendation to a user may include obtaining, via one or more processors, characteristic data of a user-defined vehicle based on one or more interactive activities of the user with a first three-dimensional model of a model vehicle, wherein the one or more interactive activities of the user includes at least altering one or more features of the model vehicle; generating, via the one or more processors, a second three-dimensional model of the user-defined vehicle based on the first three-dimensional model of the model vehicle and the characteristic data of the user-defined vehicle; obtaining, via the one or more processors, one or more images of the second three-dimensional model of the user-defined vehicle, wherein the one or more images include at least one of a front side image, a back side image, a left side image, or a right side image of the second three-dimensional model of the user-defined vehicle; generating, via the one or more processors, a selection of one or more pre-stored vehicles based on a comparison between the one or more images of the second three-dimensional model of the user-defined vehicle and pre-stored image data of the one or more pre-stored vehicles other than the user-defined vehicle via a trained machine learning algorithm; obtaining, via the one or more processors, user feedback data based on the selection of the one or more pre-stored vehicles, wherein the user feedback data indicates a user's preference of a given pre-stored vehicle of the selection of the one or more pre-stored vehicles; generating, via the one or more processors, the vehicle recommendation for the user based on the user feedback data via the trained machine learning algorithm; and transmitting, to a device associated with the user, a notification indicative of the vehicle recommendation.

In another aspect, a computer-implemented method for providing a vehicle recommendation to a user may include obtaining, via one or more processors, a first three-dimensional model of a model vehicle based on automotive data provided by the user, wherein the automotive data includes at least one of a make or model of the model vehicle; obtaining, via the one or more processors, characteristic data of a user-defined vehicle based on one or more interactive activities of the user with the model vehicle, wherein the one or more interactive activities of the user include at least altering one or more features of the model vehicle; generating, via the one or more processors, a second three-dimensional model of the user-defined vehicle based on the first three-dimensional model of the model vehicle and the characteristic data of the user-defined vehicle; obtaining, via the one or more processors, one or more images of the second three-dimensional model of the user-defined vehicle, wherein the one or more images include at least one of a front side image, a back side image, a left side image, or a right side image of the second three-dimensional model of the user-defined vehicle; obtaining, via the one or more processors, pre-stored image data of one or more pre-stored vehicles other than the user-defined vehicle based on the one or more images of the second three-dimensional model of the user-defined vehicle, wherein the pre-stored image data of the one or more pre-stored vehicles includes one or more pre-stored images of the one or more pre-stored vehicles; generating, via the one or more processors, a selection of the one or more pre-stored vehicles based on the one or more images of the second three-dimensional model of the user-defined vehicle and the pre-stored image data of the one or more pre-stored vehicles other than the user-defined vehicle via a trained machine learning algorithm; obtaining, via the one or more processors, user feedback data based on the selection of the one or more pre-stored vehicles, wherein the user feedback data indicates a user's preference of a given pre-stored vehicle of the selection of the one or more pre-stored vehicles; generating, via the one or more processors, the vehicle recommendation for the user based on the user feedback data via the trained machine learning algorithm; and transmitting, to a device associated with the user, a notification indicative of the vehicle recommendation.

In yet another aspect, a computer system for providing a vehicle recommendation to a user may include a memory storing instructions; and one or more processors configured to execute the instructions to perform operations. The operations may include obtaining characteristic data of a user-defined vehicle based on one or more interactive activities of the user with a first three-dimensional model of a model vehicle, wherein the one or more interactive activities of the user include at least altering one or more features of the model vehicle; generating a second three-dimensional model of the user-defined vehicle based on the first three-dimensional model of the model vehicle and the characteristic data of the user-defined vehicle; obtaining one or more images of the second three-dimensional model of the user-defined vehicle, wherein the one or more images include at least one of a front side image, a back side image, a left side image, or a right side image of the second three-dimensional model of the user-defined vehicle; generating a selection of one or more pre-stored vehicles based on a comparison between the one or more images of the second three-dimensional model of the user-defined vehicle and pre-stored image data of the one or more pre-stored vehicles other than the user-defined vehicle via a trained machine learning algorithm; obtaining user feedback data based on the selection of the one or more pre-stored vehicles, wherein the user feedback data indicates a user's preference of a given pre-stored vehicle of the selection of the one or more pre-stored vehicles; generating the vehicle recommendation for the user based on the user feedback data via the trained machine learning algorithm; and transmitting, to a device associated with the user, a notification indicative of the vehicle recommendation.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. Both the foregoing general description and the following detailed description are exemplary and explanatory only and are not restrictive of the features, as claimed.

In this disclosure, the term "based on" means "based at least in part on." The singular forms "a," "an," and "the" include plural referents unless the context dictates otherwise. The term "exemplary" is used in the sense of "example" rather than "ideal." The terms "comprises," "comprising," "includes," "including," or other variations thereof, are intended to cover a non-exclusive inclusion such that a process, method, or product that comprises a list of elements does not necessarily include only those elements, but may include other elements not expressly listed or inherent to such a process, method, article, or apparatus. Relative terms, such as, "substantially" and "generally," are used to indicate a possible variation of ±10% of a stated or understood value.

In the following description, embodiments will be described with reference to the accompanying drawings. As will be discussed in more detail below, in various embodiments, data such as characteristic data of a user-defined vehicle or user feedback data, may be used to determine a vehicle recommendation for the user.

Figure 1:
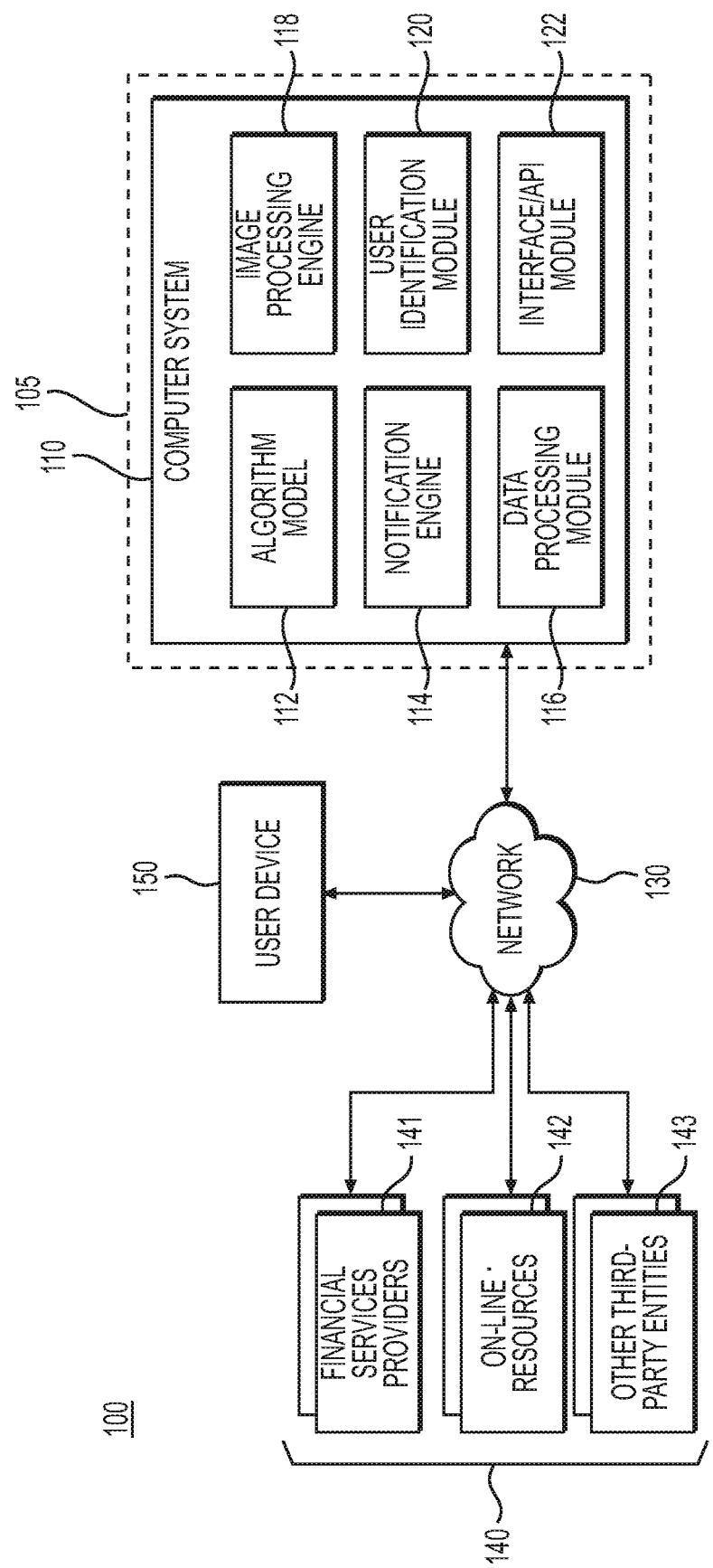
FIG. 1 depicts an exemplary system infrastructure, according to one or more embodiments.

FIG. 1 is a diagram depicting an example of a system environment 100 according to one or more embodiments of the present disclosure. The system environment 100 may include a computer system 110, a network 130, one or more resources for collecting data 140 (e.g., characteristic data of a user-defined vehicle), and a user device (or a device associated with a user) 150. The one or more resources for collecting data 140 may include financial services providers 141, on-line resources 142, or other third-party entities 143. These components may be in communication with one another via network 130.

The computer system 110 may have one or more processors configured to perform methods described in this disclosure. The computer system 110 may include one or more modules, models, or engines. The one or more modules, models, or engines may include an algorithm model 112, a notification engine 114, a data processing module 116, an image processing engine 118, a user identification module 120, and/or an interface/API module 122, which may each be software components stored in the computer system 110. The computer system 110 may be configured to utilize one or more modules, models, or engines when performing various methods described in this disclosure. In some examples, the computer system 110 may have a cloud computing platform with scalable resources for computation and/or data storage, and may run one or more applications on the cloud computing platform to perform various computer-implemented methods described in this disclosure. In some embodiments, some of the one or more modules, models, or engines may be combined to form fewer modules, models, or engines. In some embodiments, some of the one or more modules, models, or engines may be separated into separate, more numerous modules, models, or engines. In some embodiments, some of the one or more modules, models, or engines may be removed while others may be added.

The algorithm model 112 may be a plurality of algorithm models. The algorithm model 112 may include a trained machine learning model. Details of algorithm model 112 are described elsewhere herein. The notification engine 114 may be configured to generate and communicate (e.g., transmit) one or more notifications (e.g., vehicle recommendations) to a user device 150 or to one or more resources 140 through the network 130. The data processing module 116 may be configured to monitor, track, clean, process, or standardize data (e.g., characteristic data or user feedback data) received by the computer system 110. One or more algorithms may be used to clean, process, or standardize the data. The image processing engine 118 may be configured to monitor, track, clean, process, or standardize image data. The user identification module 120 may manage user identification for each user accessing the computer system 110. In one implementation, the user identification associated with each user may be stored to, and retrieved from, one or more components of data storage associated with the computer system 110 or one or more resources 140. The interface/API module 122 may allow the user to interact with one or more modules, models, or engines of the computer system 110.

Computer system 110 may be configured to receive data from other components (e.g., one or more resources 140, or user device 150) of the system environment 100 via network 130. Computer system 110 may further be configured to utilize the received data by inputting the received data into the algorithm model 112 to produce a result (e.g., a vehicle recommendation). Information indicating the result may be transmitted to user device 150 or one or more resources 140 over network 130. In some examples, the computer system 110 may be referred to as a server system that provides a service including providing the information indicating the received data and/or the result to one or more resources 140 or user device 150.

Network 130 may be any suitable network or combination of networks and may support any appropriate protocol suitable for communication of data to and from the computer system 110 and between various other components in the system environment 100. Network 130 may include a public network (e.g., the Internet), a private network (e.g., a network within an organization), or a combination of public and/or private networks. Network 130 may be configured to provide communication between various components depicted in FIG. 1. Network 130 may comprise one or more networks that connect devices and/or components in the network layout to allow communication between the devices and/or components. For example, the network 130 may be implemented as the Internet, a wireless network, a wired network (e.g., Ethernet), a local area network (LAN), a Wide Area Network (WANs), Bluetooth, Near Field Communication (NFC), or any other type of network that provides communications between one or more components of the network layout. In some embodiments, network 130 may be implemented using cell and/or pager networks, satellite, licensed radio, or a combination of licensed and unlicensed radio.

Financial services providers 141 may be an entity such as a bank, credit card issuer, merchant services providers, or other type of financial service entity. In some examples, financial services providers 141 may include one or more merchant services providers that provide merchants with the ability to accept electronic payments, such as payments using credit cards and debit cards. Therefore, financial services providers 141 may collect and store data pertaining to transactions occurring at the merchants. In some embodiment, financial services providers 141 may provide a platform (e.g., an app on a user device) that a user can interact with. Such user interactions may provide data (e.g., user feedback data) that may be analyzed or used in the method disclosed herein. The financial services providers 141 may include one or more databases to store any information related to the user or the vehicle recommendation. The financial services providers 141 may provide services associated with vehicle transactions.

Online resources 142 may include webpage, e-mail, apps, or social networking sites. Online resources 142 may be provided by manufacturers, vehicle dealers, retailers, consumer promotion agencies, and other entities. For example, online resources 142 may include a webpage that users can access to select, buy, or sell a vehicle. Online resources 142 may include other computer systems, such as web servers, that are accessible by computer system 110.

Other third-party entities 143 may be any entity that is not a financial services provider 141 or online resources 142. For example, other third-party entities 143 may include a merchant or a person (e.g., family member). Other third-party entities 143 may include merchants that may each be an entity that provides products. The term "product," in the context of products offered by a merchant, encompasses both goods and services, as well as products that are a combination of goods and services. A merchant may be, for example, a retailer, a vehicle dealer, a grocery store, an entertainment venue, a service provider, a restaurant, a bar, a non-profit organization, or other type of entity that provides products that a consumer may consume. A merchant may have one or more venues that a consumer may physically visit in order to obtain the products (goods or services) offered by the merchant. In some embodiments, other third-party entities 143 may provide a platform (e.g., an app on a user device) with which a user can interact. Such user interactions may provide data (e.g., user feedback data) that may be analyzed or used in the method disclosed herein.

The financial services providers 141, the online resources 142, or any other type of third-party entities 143 may each include one or more computer systems configured to gather, process, transmit, and/or receive data. In general, whenever any of financial services providers 141, the online resources 142, or any other type of third-party entities 143 is described as performing an operation of gathering, processing, transmitting, or receiving data, it is understood that such operations may be performed by a computer system thereof. In general, a computer system may include one or more computing devices, as described in connection with FIG. 5 below.

User device 150 may operate a client program, also referred to as a user application or third-party application, used to communicate with the computer system 110. The client program may be provided by the financial services providers 141, the online resources 142, or any other type of third-party entities 143. This user application may be used to accept user input or provide information (e.g., one or more images of a second three-dimensional model of a user-defined vehicle) to the computer system 110 and to receive information from the computer system 110. In some examples, the user application may be a mobile application that is run on user device 150. User device 150 may be a mobile device (e.g., smartphone, tablet, pager, personal digital assistant (PDA)), a computer (e.g., laptop computer, desktop computer, server), or a wearable device (e.g., smart watch). User device 150 can also include any other media content player, for example, a set-top box, a television set, a video game system, or any electronic device capable of providing or rendering data. User device 150 may optionally be portable. The user device may be handheld. User device 150 may be a network device capable of connecting to a network, such as network 130, or other networks such as a local area network (LAN), wide area network (WAN) such as the Internet, a telecommunications network, a data network, or any other type of network.

Computer system 110 may be part of an entity 105, which may be any type of company, organization, or institution. In some examples, entity 105 may be a financial services provider. In such examples, the computer system 110 may have access to data pertaining to transactions through a private network within the entity 105. For example if the entity 105 is a card issuer, entity 105 may collect and store data involving a credit card or debit card issued by the entity 105. In such examples, the computer system 110 may still receive data from other financial services providers 141.

Figure 2:
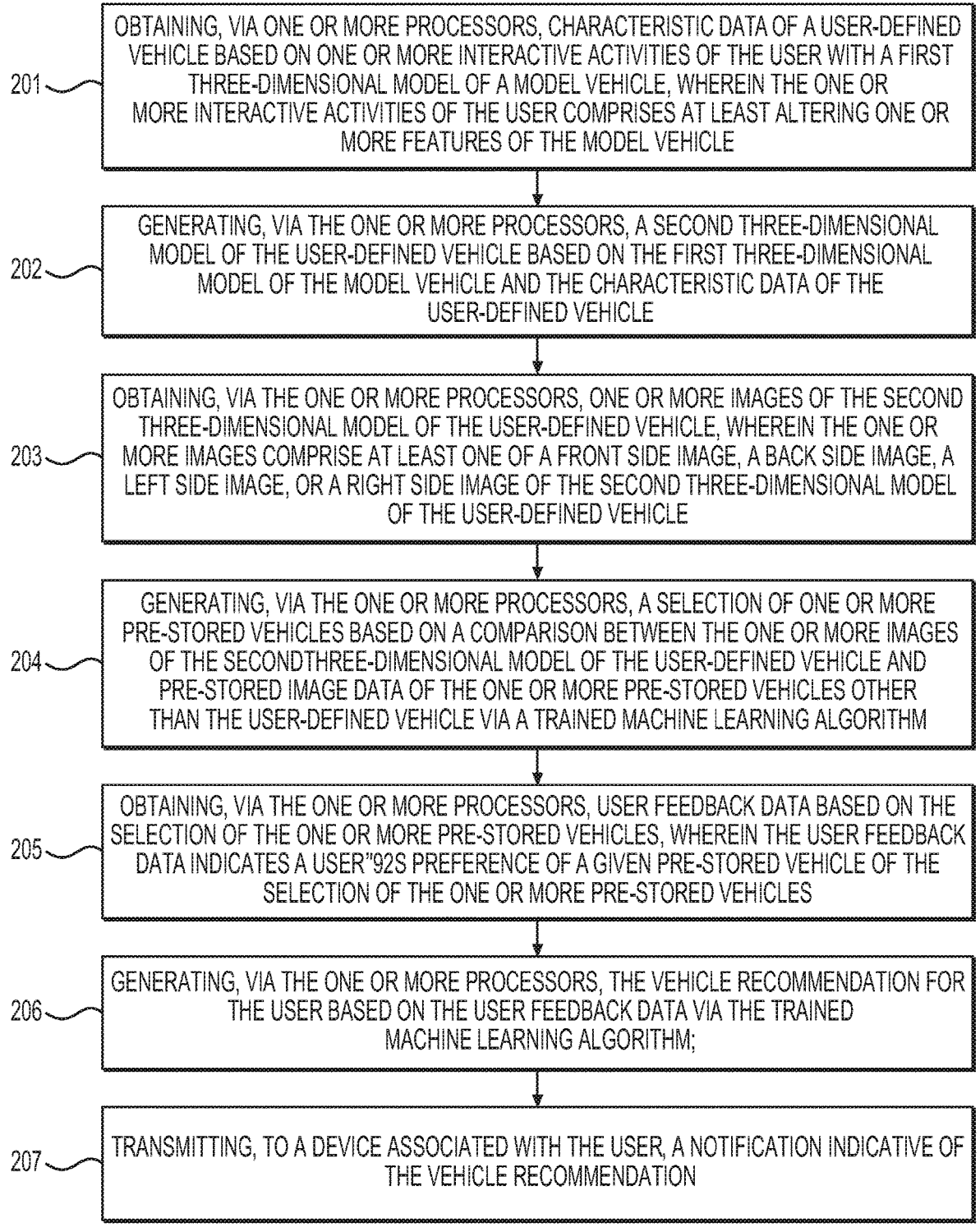
FIG. 2 depicts a flowchart of an exemplary method of providing a vehicle recommendation to a user, according to one or more embodiments.

FIG. 2 is a flowchart illustrating a method for providing a vehicle recommendation to a user, according to one or more embodiments of the present disclosure. The method may be performed by computer system 110.

Step 201 may include a step of obtaining, via one or more processors, characteristic data of a user-defined vehicle based on one or more interactive activities of the user with a first three-dimensional model of a model vehicle. In some embodiments, the first three-dimensional model of the model vehicle may be displayed on the display screen of a device associated with the user (e.g., user device 150) in any suitable form, such as an image, a web application, and/or any form of graphical user interface. Each three-dimensional model of a model vehicle may include an interactive representation of a vehicle possessing one or more features for consideration by a user to determine user preference with respect to the one or more features. The user device 150 may be capable of accepting one or more interactive activities of the user via one or more interactive components of the user device 150, such as a keyboard, button, mouse, touchscreen, touchpad, joystick, trackball, camera, microphone, or motion sensor input (e.g., an input device 550 as described in connection with FIG. 5, below).

The first three-dimensional model of the model vehicle may be stored in one or more databases of the one or more sources 140. The one or more databases may be one or more memory devices configured to store the first three-dimensional model of the model vehicle. The one or more databases may be implemented as a computer system with a storage device. The one or more databases may be used by components of the network layout to perform one or more operations consistent with the disclosed embodiments. The one or more the databases may be located with one or more servers associated with one or more resources 140, and/or located with one another via the network. The one or more databases may store a plurality of the first three-dimensional models of model vehicles.

The one or more interactive activities of the user may include at least altering one or more features of the first three-dimensional model vehicle. The one or more interactive activities of the user may further include any actions that a user performed on the first three-dimensional model vehicle, including, switching the first three-dimensional model vehicle with another three-dimensional model vehicle stored in one or more databases, enlarging the first three-dimensional model of the model vehicle, rotating the first three-dimensional model of the model vehicle, moving the first three-dimensional model of the model vehicle, or cropping the first three-dimensional model of the model vehicle. The altering of one or more features of the model vehicle may include changing the size, shape, design of the one or more features of the model vehicle. The altering one or more features of the first three-dimensional model vehicle may also include removing or adding one or more features of the first three-dimensional model vehicle. The altering of one or more features of the first three-dimensional model vehicle may also include replacing one or more features of the first three-dimensional model vehicle with one or more features of another vehicle stored in one or more databases.

The one or more features of the model vehicle may include one or more exterior features or one or more interior features of the model vehicle. The one or more exterior features of the model vehicle may include at least one of a wheel feature, a color feature, or a shape feature of the model vehicle. The wheel feature of the model vehicle may include, for example, the size (e.g., the diameter and width), the brand, the type, the safety level, the rim, the hubcap, or the material of the wheel. The color feature may include any information regarding colors or finishes of the exterior of the model vehicle. The colors of the model vehicle may include, by way of example, red, white, blue, black, silver, gold, yellow, orange, pink, green, or gray. The finishes of the exterior of the model vehicle may include, for example, matte finish, pearlescent finish, metallic finish, or gloss finish. The shape feature of the model vehicle may include the shape of any portion of the exterior of the model vehicle, including, the shape of the front side of the model vehicle, the shape of the flank side of the model vehicle, or the shape of the back side of the model vehicle. The one or more exterior features of the model vehicle may also include any information regarding the model vehicle, including, but not limited to, vehicle class (e.g., convertible, coupe, sedan, hatchback, sport-utility vehicle, cross-over, minivan, van, or wagon), rear luggage compartment volume, door features (e.g., falcon wing doors, or automatic doors), light features (e.g., color and shape of the tail light), towing capacity (e.g., 4000 lbs. towing limit), mirror features (e.g., shape of the rear mirror, heated side mirrors), sensor and monitor features (e.g., including proximity sensors, humidity sensors, or temperatures sensors), placement of exterior features (e.g., the location of tail lights, placement of license plate holder), or roof features (e.g., sun roof, moon roof, panoramic roof).

The one or more interior features of the model vehicle may include at least one of a material feature, an electronics feature, an engine feature, an internal shape feature, or an add-on feature of the model vehicle. The material feature may include any information regarding the material of the interior of the model vehicle, including, for example, the material of the seats (e.g., leather, cloth, suede, etc.). The electronics feature may include any information regarding electronics in the model vehicle, including, for example, audio and multi-media (e.g., in-car internet streaming music and media), internet browser, navigation system, on-board safety or convenience features (e.g., emergency breaking, self-driving, lane assist, self-parking. The engine feature may include any information regarding the engine of the model vehicle, including, but not limited to, types of engines (e.g., internal combustion engines, external combustion engines, hybrid engines, or electronic-powered engines), engine layout (e.g., front engine layout), maximum engine speed, max engine power, design and cylinders, valves, drivetrain type (e.g., 4-wheel drive, all-wheel drive, front-wheel drive, or rear-wheel drive), transmission type (e.g., automatic or manual), fuel type (e.g., diesel, electric, gasoline, hybrid, or flex-fuel), or max torque. The internal shape feature may include any information regarding an internal shape of the vehicle (e.g., inner shape of a vehicle frame). The add-on feature may include any additional interior features of the model vehicle, including, seat features (e.g., heated seat, cooled seat, the number of seats), steering wheel features (e.g., heated steering wheel, cooled steering wheel), interior door features (e.g., metal handle), or sun visor feature (e.g., with vanity mirrors). The one or more features may also include any features of the model vehicle, including, but are not limited to, the performance of the model vehicle (e.g., track speed, 0-60 mph), the history of the model vehicle (e.g., years of manufacturing, mileage), service features (e.g., 4 years of warranty), or break features.

The characteristic data of the user-defined vehicle may include any information regarding the one or more altered features of the model vehicle. For instance, a user may interact with the first three-dimensional model of the model vehicle via a three dimensional modeling tool (e.g., Blender) and alter the wheel size of a Toyota Corolla from 16 inches to 17 inches. In this situation, the model vehicle is the Toyota Corolla, the user-defined vehicle may be an updated Toyota Corolla with its wheels replaced by the 17 inch wheels, and the characteristic data of the user-defined vehicle may include any information regarding the updated Toyota Corolla with its wheels replaced by the 17 inches wheels.

Step 202 may include a step of generating, via the one or more processors, a second three-dimensional model of the user-defined vehicle based on the first three-dimensional model of the model vehicle and the characteristic data of the user-defined vehicle. In some embodiments, the second three-dimensional model may be a combination of the first three-dimensional model of the model vehicle and the characteristic data of the user-defined vehicle. For instance, the model vehicle may be a Tesla model S, and the user may interact with the first three-dimensional model of the model vehicle via a three dimensional modeling tool (e.g., Blender) and alter the door type of the Tesla model S to a falcon wing type door. In this situation, the characteristic data of the user-defined vehicle may include the falcon wing type door, and the user defined vehicle may be the combination of Tesla model S and a falcon wing type door.

Figure 3:
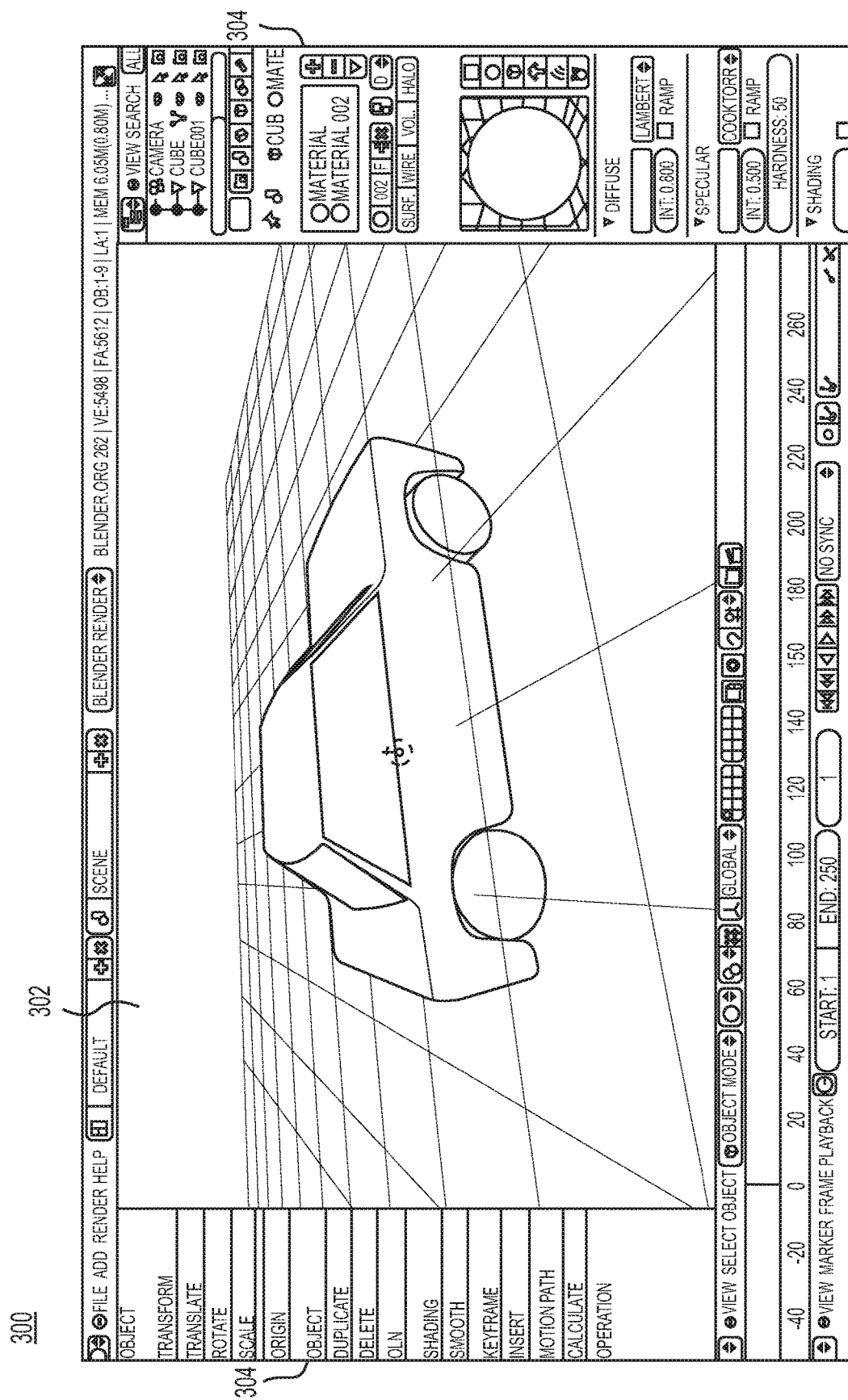
FIG. 3 illustrates an exemplary user interface for obtaining characteristic data of a user-defined vehicle, according to one or more embodiments.

FIG. 3 illustrates a graphical representation of an exemplary user interface 300 provided on user device 150 of FIG. 1. The user interface may be associated with software installed on the user device, or may be made available to the user via a website or application. The user can interact with such user interface 300 to alter one or more features of the first three-dimensional model of the model vehicle to generate the second three-dimensional model of the user-defined vehicle. In this example, the user device 150 may be a laptop executing software. The software interface or user interface 300 may be displayed to the user after the user selects the model vehicle. In other embodiments, similar information illustrated in FIG. 3 may be presented in a different format via software executing on an electronic device (e.g., a desktop, mobile phone, or tablet computer) serving as the user device 150.

The user interface 300 may include one or more windows. The one or more windows may include a three-dimensional image window 302 and a plurality of operation windows 304. The three-dimensional image window 302 may display to the user any three-dimensional model of a vehicle, including the first three-dimensional model of the model vehicle or the second three-dimensional model of the user-defined vehicle. The plurality of operation windows 304 may each enable the user to interact with the vehicle presented in the three-dimensional image window 302. As shown in the FIG. 3, the plurality of operation windows 304 may include one or more interactive components to adjust the shape, material, color, or size of the three-dimensional model of the vehicle. Additionally, the user interface 300 may include one or more graphical elements, including, but not limited to, input controls (e.g., checkboxes, radio buttons, dropdown lists, list boxes, buttons, toggles, text fields, date field), navigational components (e.g., breadcrumb, slider, search field, pagination, slider, tags, icons), informational components (e.g., tooltips, icons, progress bar, notifications, message boxes, modal windows), or containers (e.g., accordion).

Returning to FIG. 2, step 203 may include a step of obtaining, via the one or more processors, one or more images of the second three-dimensional model of the user-defined vehicle. The one or more images may include at least one of a front side image, a back side image, a left side image, or a right side image of the second three-dimensional model of the user-defined vehicle. The one or more images may include an image of the second three-dimensional model of the user-defined vehicle from an angle. For instance, the image may include an image of the second three-dimensional model of the user-defined vehicle taken from a 45-degree angle relative to the horizontal plane parallel to the floor. The one or more images may include a vectorized image of a portion of the second three-dimensional model of the user-defined vehicle. The vectorized (or mesh) image may enable a user or one or more algorithms to examine details of the second three-dimensional model due to its format. The one or more images may include an enlarged image of a portion of the second three-dimensional model of the user-defined vehicle. The portion of the second three-dimensional model of the user-defined vehicle may be any part of the user-defined vehicle. For instance, if the user-defined vehicle is a combination of Tesla model S and a falcon wing type door, an enlarged image of a portion of the second three-dimensional model of the user-defined vehicle may be an enlarged image of the falcon wing type door.

In some embodiments, the one or more images of the second three-dimensional model of the user-defined vehicle may be obtained via one or more algorithms. The one or more algorithms may define the angles of obtaining the one or more images. In some embodiments, the one or more images of the second three-dimensional model of the user-defined vehicle may be obtained via one or more interactive components displayed on the user interface 300, as shown in FIG. 3. In this situation, the user may interact with the interactive components to obtain the one or more images. In some embodiments, the one or more images of the second three-dimensional model of the user-defined vehicle may be obtained via an imaging device or imaging app associated with the user device 150. For instance, the second three-dimensional model of the user-defined vehicle may be displayed on a laptop, and the user may use a mobile phone or other type of user device to obtain the one or more images of the second three-dimensional model of the user-defined vehicle. The imaging device can include hardware and/or software elements. In some embodiments, the imaging device may be a camera operably coupled to the user device. The imaging device can be controlled by an application/software configured to display the three-dimensional modeling tool. In other embodiments, the camera can be controlled by a processor natively embedded in the user device 150.

Step 204 may include generating, via the one or more processors, a selection of one or more pre-stored vehicles based on a comparison between the one or more images of the second three-dimensional model of the user-defined vehicle and pre-stored image data of the one or more pre-stored vehicles other than the user-defined vehicle via a trained machine learning algorithm. The pre-stored image data of the one or more pre-stored vehicles may include one or more pre-stored images of the one or more pre-stored vehicles. One or more algorithms may be used to compare the one or more images of the second three-dimensional model of the user-defined vehicle and pre-stored image data of the one or more pre-stored vehicles other than the user-defined vehicle. Such comparison may be used to determine whether there is a match (e.g., a complete match or a match equal to or exceeding a predetermined threshold of similarity) between the one or more images of the second three-dimensional model of the user-defined vehicle and pre-stored image data of the one or more pre-stored vehicles other than the user-defined vehicle. The method of providing a vehicle recommendation may be permitted to be completed, may be stopped, or may include additional steps (e.g., more user interaction with the three dimensional modeling tool) to occur, based on whether there is a match (e.g., a complete match or a match equal to or exceeding a predetermined threshold of similarity) between the one or more images of the second three-dimensional model of the user-defined vehicle and pre-stored image data of the one or more pre-stored vehicles other than the user-defined vehicle.

The comparison between the one or more images of the second three-dimensional model of the user-defined vehicle and pre-stored image data of the one or more pre-stored vehicles other than the user-defined vehicle may include analyzing a degree of match between the one or more images of the second three-dimensional model of the user-defined vehicle and pre-stored image data of the one or more pre-stored vehicles other than the user-defined vehicle. For instance, if the one or more images of the second three-dimensional model of the user-defined vehicle include a front side image of the second three-dimensional model of the user-defined vehicle and the pre-stored image data of the one or more pre-stored vehicles includes a front side image of one pre-stored vehicles, the comparison between the one or more images of the second three-dimensional model of the user-defined vehicle and pre-stored image data of the one or more pre-stored vehicles may include analyzing a match (e.g., a complete match or a match equal to or exceeding a predetermined threshold of similarity) between the front side image of the second three-dimensional model of the user-defined vehicle and the front side image of pre-stored vehicle.

The pre-stored image data of the one or more pre-stored vehicles may be generated when the one or more pre-stored vehicles are registered, presented, or identified by one or more transaction systems or one or more transactional entities. The one or more transactional entities may include one or more merchants including one or more vehicle dealers, financial services providers (e.g., financial services providers 141), or online resources. In some embodiments, the pre-stored image data may be obtained via an imaging device associated with a device. The imaging device can include hardware and/or software elements. In some embodiments, the imaging device may be a camera operably coupled to the device. The device may be an electronic mobile device. Once the pre-stored image data of the one or more pre-stored vehicles is obtained, it may be stored with other information regarding the one or more pre-stored vehicles. The pre-stored image data of the one or more pre-stored vehicles may be stored in one or more memory units, cookies, caches, browsing histories, and/or browser fingerprints. The pre-stored image data of the one or more pre-stored vehicles may be distributed over multiple devices or systems (e.g., peer-to-peer, cloud-computing based infrastructure, between the reader and an external device).

The selection of the one or more pre-stored vehicles may include a rank of the pre-stored vehicles based on a level of similarity between the pre-stored vehicles and the user-defined vehicle. The higher the level of similarity between a pre-stored vehicle and the user-defined vehicle, the higher the rank of the pre-stored vehicle. For instance, in a first scenario, the front side image of a pre-stored vehicle and the front side image of the user-defined vehicle may be the same, and the right side image of the pre-stored vehicle and the right side image of the user-defined vehicle may be the same, then the degree of similarity between the pre-stored vehicle and the user defined vehicle may be relatively high (e.g., equal to or exceeding a predetermined threshold of similarity). In a second scenario, the front side image of a pre-stored vehicle and the front side image of the user-defined vehicle may not be the same, and the right side image of the pre-stored vehicle and the right side image of the user-defined vehicle may be the same. Accordingly, the degree of similarity in the second scenario may be lower than the degree of similarity in the first scenario. In the rank of the pre-stored vehicles, the pre-stored vehicle in the first scenario ranks higher than the pre-stored vehicle in the second scenario. The degree of similarity may include statistical measurements, such as Gaussian similarities.

The trained machine learning algorithm may include a regression-based model that accepts the characteristics data of a user-defined vehicle, one or more images of the user-defined vehicle, pre-stored image data of the one or more pre-stored vehicles, user feedback data, and/or the vehicle recommendations as input data. The trained machine learning algorithm may be part of the algorithm model 112. The trained machine learning algorithm may be of any suitable form, and may include, for example, a neural network. A neural network may be software representing a human neural system (e.g., cognitive system). A neural network may include a series of layers termed "neurons" or "nodes." A neural network may comprise an input layer, to which data is presented, one or more internal layers, and an output layer. The number of neurons in each layer may be related to the complexity of a problem to be solved. Input neurons may receive data being presented and then transmit the data to the first internal layer through the connections' weight. The trained machine learning algorithm may include a convolutional neural network (CNN), a deep neural network, or a recurrent neural network (RNN).

A CNN may be a deep and feed-forward artificial neural network. A CNN may be applicable to analyzing visual images, such as the one or more images of the second three-dimensional model of the user-defined vehicle and pre-stored image data, described elsewhere herein. A CNN may include an input layer, an output layer, and multiple hidden layers. Hidden layers of a CNN may include convolutional layers, pooling layers, or normalization layers. Layers may be organized in three dimensions: width, height, and depth. The total number of convolutional layers may be at least about 3, 4, 5, 10, 15, 20 or more. The total number of convolutional layers may be at most about 20, 15, 10, 5, 4, or less.

Convolutional layers may apply a convolution operation to an input and pass results of a convolution operation to a next layer. For processing images, a convolution operation may reduce the number of free parameters, allowing a network to be deeper with fewer parameters. In a convolutional layer, neurons may receive input from only a restricted subarea of a previous layer. A convolutional layer's parameters may comprise a set of learnable filters (or kernels). Learnable filters may have a small receptive field and extend through the full depth of an input volume. During a forward pass, each filter may be convolved across the width and height of an input volume, compute a dot product between entries of a filter and an input, and produce a 2-dimensional activation map of that filter. As a result, a network may learn filters that activate when detecting some specific type of feature at some spatial position as an input.

An RNN may be configured to receive sequential data (e.g., user feedback data) as an input, such as consecutive data inputs, and the RNN may update the internal state at every time step. An RNN can be applicable to tasks such as image captioning or time series anomaly detection. The RNN may include a fully recurrent neural network, independently recurrent neural network, Jordan networks, Echo state, neural history compressor, gated recurrent unit, multiple timescales model, differentiable neural computer, or any combination thereof.

The trained machine learning algorithm may compute the vehicle recommendation as a function of the characteristics data of a user-defined vehicle, one or more images of the user-defined vehicle, pre-stored image data of the one or more pre-stored vehicles, user feedback data, or one or more variables indicated in the input data. The one or more variables may be derived from the characteristic data of a user-defined vehicle, one or more images of the user-defined vehicle, pre-stored image data of the one or more pre-stored vehicles, or user feedback data. This function may be learned by training the machine learning algorithm with training sets.

The machine learning algorithm may be trained by supervised, unsupervised, or semi-supervised learning using training sets comprising data of types similar to the type of data used as the model input. For example, the training set used to train the model may include any combination of the following: the characteristic data of a user-defined vehicle, one or more images of the user-defined vehicle, pre-stored image data of the one or more pre-stored vehicles, user feedback data, the characteristic data of a vehicle defined by customers other than the user, one or more images of the vehicle defined by customers other than the user, or feedback data of customers other than the user. Additionally, the training set used to train the model may further include user data, including, but not limited to, demographic information of the user or other data related to the user. Accordingly, the machine learning model may be trained to map input variables to a quantity or value of a vehicle recommendation for the user. That is, the machine learning model may be trained to determine a quantity or value of the vehicle recommendation of the user as a function of various input variables.

Step 205 may include obtaining, via the one or more processors, user feedback data based on the selection of the one or more pre-stored vehicles. The user feedback data may indicate a user's preference of a given pre-stored vehicle listed in the selection of the one or more pre-stored vehicles. For instance, the user may be presented with a rank of the selection of the one or more pre-stored vehicles via a display of the device associated with the user (e.g., user device 150), and the user feedback data may include whether the user likes or dislikes a given pre-stored vehicle listed in the selection of the one or more pre-stored vehicles. The user feedback data may be inserted into the trained machine learning algorithm (e.g., a recurrent neural network) to update the trained machine learning algorithm.

Step 206 may include generating, via the one or more processors, the vehicle recommendation for the user based on the user feedback data via the trained machine learning algorithm. The vehicle recommendation may include a recommended vehicle available for purchase. The vehicle recommendation may include any information regarding the recommended vehicle including, but not limited to, images, prices, models, makes, years of manufacturing, or mileages of the recommended vehicle. The vehicle recommendation may also include any information regarding one or more dealers who sell the recommended vehicle, including, but not limited to, the names of the dealers or the addresses of the dealers. The vehicle recommendation may also include any information regarding purchasing a vehicle by the user, for example, a recommended location to purchase the recommended vehicle, or a recommended time to purchase the recommended vehicle. The vehicle recommendation may include upgrade or repair information specific to the recommended vehicle, news articles pertaining to the recommended vehicle, possible substitute or compatible items for the recommended vehicle, and so forth. Although a vehicle recommendation is described herein as an example, the method can be utilized to provide recommendation for other products. The product may be any item or service sold by a merchant.

Step 207 may include transmitting, to a device associated with the user, a notification indicative of the vehicle recommendation. The notification may include information regarding the vehicle recommendation. The notification may be displayed in a user interface. In some embodiments, the notification may be configured to be displayed on a display screen of a user device associated with the user (e.g., user device 150). The notification may be displayed on the display screen in any suitable form, such as an e-mail, a text message, a push notification, content on a webpage, and/or any form of graphical user interface. The user device 150 may be capable of accepting inputs of a user via one or more interactive components of the user device 150, such as a keyboard, button, mouse, touchscreen, touchpad, joystick, trackball, camera, microphone, or motion sensor. In some examples, step 207 may occur in response to a trigger condition. For example, the notification engine 114 may detect a trigger condition that a level of similarity between a pre-stored vehicle and the user-defined vehicle is higher than a predetermined threshold value, and then transmit information regarding the pre-stored vehicle to the user device 150. The predetermined threshold value may be at least 10%, 20%, 30%, 40%, 50%, 60%, 70%, 80%, 90% or more. In other embodiments, the predetermined threshold value may be at most 90%, 80%, 70%, 60%, 50%, 40%, 30%, 20%, 10% or less.

Figure 4:
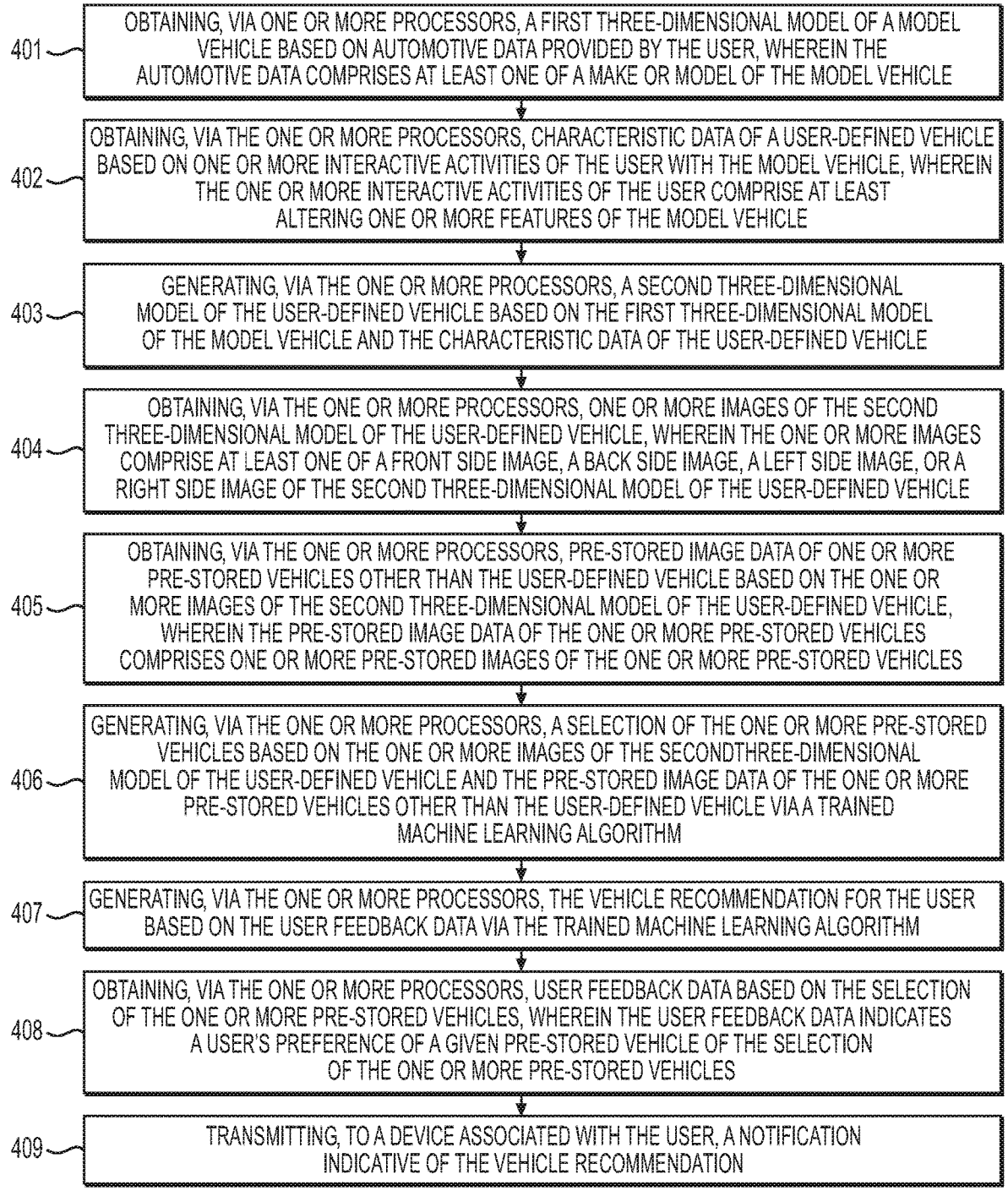
FIG. 4 depicts a flowchart of another exemplary method of providing a vehicle recommendation to a user, according to one or more embodiments.

FIG. 4 is a flowchart illustrating another exemplary method for providing a vehicle recommendation to the user, according to one or more embodiments of the present disclosure. The method may be performed by computer system 110.

Step 401 may include obtaining, via one or more processors, a first three-dimensional model of a model vehicle based on automotive data provided by the user. The automotive data may be provided by the user via the device associated with the user. The automotive data may be provided by the user via one or more interactive activities of the user with one or more interactive components of the user device. The one or more interactive activities may include clicking on an image, link, or button displayed on a display of the device associated with the user. The device associated with the user may be capable of accepting inputs of a user via one or more interactive components of the user device, such as a keyboard, button, mouse, touchscreen, touchpad, joystick, trackball, camera, microphone, or motion sensor input (e.g., an input device 550 as described in connection with FIG. 5, below). One or more user interfaces (e.g., a website) may interact with the user to collect the automotive data. For instance, the user may type any information related to the model vehicle via a keyboard provided on the display of the device associated with the user. In another example, the user may click on one or more selections regarding the model vehicle displayed on a display of the user device. The one or more selections may be in a form of a link, button, or hyperlink.

The automotive data may include at least one of a make or model of the model vehicle. For instance, a user may type the make and model of the model vehicle in a user interface presented on the user device, then the first three-dimensional model of the model vehicle may be shown on the user interface, as shown in FIG. 3. In some embodiments, the automotive data may include any information related to the model vehicle, including, but not limited to, the mileage, the price, the headlights, the brake lights, the mirror, the seat, the material, the paint, the engine, the transmission, the dimensions, the steering, the brakes the weights and capacities, the tires, the warranty information, or the multimedia options of the model vehicle.

Step 402, similar to step 201, may include obtaining, via the one or more processors, characteristic data of a user-defined vehicle based on one or more interactive activities of the user with the model vehicle. The one or more interactive activities of the user may include at least altering one or more features of the model vehicle. Details of the one or more interactive activities or altering one or more features of the model vehicle are described elsewhere herein. The one or more features of the model vehicle include one or more exterior features and/or one or more interior features of the model vehicle. Details of the one or more features (e.g., the one or more exterior features and/or the one or more interior features) of the model vehicle are described elsewhere herein.

Step 403, similar to step 202, may include generating, via the one or more processors, a second three-dimensional model of the user-defined vehicle based on the first three-dimensional model of the model vehicle and the characteristic data of the user-defined vehicle. In some embodiments, the second three-dimensional model may be a combination of the first three-dimensional model of the model vehicle and the characteristic data of the user-defined vehicle. For instance, the model vehicle may be a Volkswagen Beetle, and the user may interact with the first three-dimensional model of the model vehicle via a three dimensional modeling tool (e.g., Blender) and alter the front shape of the Volkswagen Beetle to an increasingly angular (e.g., tapered rather than curved) profile. In this situation, the characteristic data of the user-defined vehicle may include the modified front profile, and the user defined vehicle may be the combination of the Volkswagen Beetle and the modified front profile.

Step 404, similar to step 203, may include obtaining, via the one or more processors, one or more images of the second three-dimensional model of the user-defined vehicle. The one or more images may include at least one of a front side image, a back side image, a left side image, or a right side image of the second three-dimensional model of the user-defined vehicle. The one or more images may include a vectorized image of a portion of the second three-dimensional model of the user-defined vehicle. Details of the one or more images are described elsewhere herein.

Step 405 may include obtaining, via the one or more processors, pre-stored image data of one or more pre-stored vehicles other than the user-defined vehicle based on the one or more images of the second three-dimensional model of the user-defined vehicle. The pre-stored image data of the one or more pre-stored vehicles may include one or more pre-stored images of the one or more pre-stored vehicles. Details of the pre-stored image data is described elsewhere herein.

Step 406, similar to step 204, may include generating, via the one or more processors, a selection of the one or more pre-stored vehicles based on the one or more images of the second three-dimensional model of the user-defined vehicle and the pre-stored image data of the one or more pre-stored vehicles other than the user-defined vehicle via a trained machine learning algorithm. The selection of the one or more pre-stored vehicles may be generated based on a comparison between the one or more images of the second three-dimensional model of the user-defined vehicle and the pre-stored image data of the one or more pre-stored vehicles other than the user-defined vehicle. The selection of the one or more pre-stored vehicles may include a rank of the pre-stored vehicles based on a level of similarity between the pre-stored vehicles and the user-defined vehicle. The trained machine learning algorithm may include a convolutional neural network or a recurrent neural network. Details of the comparison between the one or more images of the second three-dimensional model of the user-defined vehicle and the pre-stored image data, the level of similarity between the pre-stored vehicles and the user-defined vehicle, and the trained machine learning algorithm are described elsewhere herein.

Step 407, similar to step 205, may include obtaining, via the one or more processors, user feedback data based on the selection of the one or more pre-stored vehicles. The user feedback data may indicate a user's preference of a given pre-stored vehicle of the selection of the one or more pre-stored vehicles. Details of the user feedback data are described elsewhere herein.

Step 408, similar to step 206, may include generating, via the one or more processors, the vehicle recommendation for the user based on the user feedback data via the trained machine learning algorithm. The vehicle recommendation may include a recommended vehicle available for purchase. The recommended vehicle may be one of the one or more pre-stored vehicles. In some embodiments, the recommended vehicle may be a complete match of the user-defined vehicle. In some embodiments, the recommended vehicle may not be a complete match of the user-defined vehicle, but may be a match equal to or exceeding a predetermined threshold value of similarity. The vehicle recommendation may include any information regarding the recommended vehicle including, but not limited to, images, prices, models, makes, years of manufacturing, or mileages of the one or more recommended vehicles. The vehicle recommendation may also include any information regarding the one or more dealers who sell the recommended vehicle, including, but not limited to, the names of the dealers or the addresses of the dealers. The vehicle recommendation may also include any information regarding purchasing a vehicle by the user, for example, a recommended location to purchase the recommended vehicle, or a recommended time to purchase the recommended vehicle. The vehicle recommendation may include upgrade or repair information specific to the recommended vehicle, news articles pertaining to the recommended vehicle, possible substitute or compatible items for the recommended vehicle, and so forth. Although vehicle recommendation is described herein as an example, the method can be utilized to provide a recommendation for other products. The product may be any item or service sold by a merchant.

Step 409, similar to step 207, may include transmitting, to a device associated with the user, a notification indicative of the vehicle recommendation. The notification may be configured to be displayed on a display screen of a user device associated with the user (e.g., user device 150). The notification may be displayed on the display screen in any suitable form, such as an e-mail, a text message, a push notification, content on a webpage, and/or any form of graphical user interface. The user device 150 may be capable of accepting inputs of a user via one or more interactive components of the user device 150, such as a keyboard, button, mouse, touchscreen, touchpad, joystick, trackball, camera, microphone, or motion sensor. In some examples, step 409 may occur in response to a trigger condition. Additional details of the notification are described elsewhere herein.

At any stage of providing a vehicle recommendation, the method may further include storing the characteristic data of the user-defined vehicle, one or more images of the second three-dimensional model of the user-defined vehicle, user feedback data, or vehicle recommendation for subsequent analysis. The stored data may have an expiration period. The expiration period may be at least 1 day, 1 week, 1 month, 1 quarter, 1 year, or longer. In other embodiments, the expiration period may be at most 1 year, 1 quarter, 1 month, 1 week, 1 day, or shorter. The subsequent analysis may include analyzing the vehicle recommendation to update characteristic data of the user-defined vehicle, one or more images of the second three-dimensional model of the user-defined vehicle, or user feedback data of the user. The stored data may also be one of the one or more variables used in training a trained machine learning model. Details of the trained machine learning model are described elsewhere herein.

In some embodiments, the method of providing a vehicle recommendation may include presenting a user with a model vehicle via a three dimensional modeling tool displayed on a graphical user interface; allowing the user to interact with the model vehicle via the three dimensional modeling tool to change features of the model vehicle; presenting, via a trained machine learning algorithm, a user with a recommended vehicle based on how the user changes the features of the model vehicle; and updating, via the trained machine learning algorithm, the recommended vehicle if the user provides any user feedback to the recommended vehicle. For example, a user may change a model vehicle by increasing the wheel size by 2 inches and decreasing the overall vehicle height by 3 inches, and the computer system may find a recommended vehicle with a lower height but same wheel size via a trained machine learning algorithm. If the user's feedback indicates dissatisfaction/dislike regarding the recommended vehicle, such user feedback may mean that the user prefers the larger wheels more than they prefer vehicles having a lower height. The computer system may then update the recommended car by focusing more on larger wheels via the trained machine learning algorithm. This method may allow the user to have unlimited freedom in altering the model vehicle to meet his/her preferences, leading to increased customer satisfaction and ease of identifying a vehicle.

In general, any process discussed in this disclosure that is understood to be computer-implementable, such as the processes illustrated in FIGS. 2 and 4, may be performed by one or more processors of a computer system, such as computer system 110, as described above. A process or process step performed by one or more processors may also be referred to as an operation. The one or more processors may be configured to perform such processes by having access to instructions (e.g., software or computer-readable code) that, when executed by the one or more processors, cause the one or more processors to perform the processes. The instructions may be stored in a memory of the computer system. A processor may be a central processing unit (CPU), a graphics processing unit (GPU), or any suitable type of processing unit.

A computer system, such as computer system 110 and/or user device 150, may include one or more computing devices. If the one or more processors of the computer system 110 and/or user device 150 are implemented as a plurality of processors, the plurality of processors may be included in a single computing device or distributed among a plurality of computing devices. If computer system 110 and/or user device 150 comprises a plurality of computing devices, the memory of the computer system 110 may include the respective memory of each computing device of the plurality of computing devices.

Figure 5:
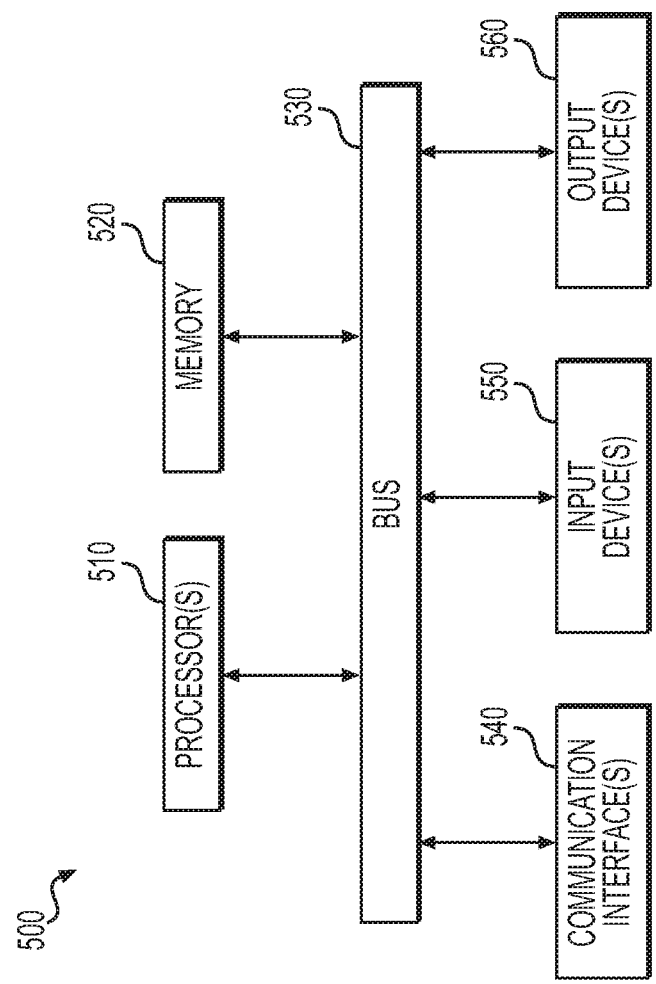
FIG. 5 depicts an example of a computing device, according to one or more embodiments.

FIG. 5 illustrates an example of a computing device 500 of a computer system, such as computer system 110 and/or user device 150. The computing device 500 may include processor(s) 510 (e.g., CPU, GPU, or other such processing unit(s)), a memory 520, and communication interface(s) 540 (e.g., a network interface) to communicate with other devices. Memory 520 may include volatile memory, such as RAM, and/or non-volatile memory, such as ROM and storage media. Examples of storage media include solid-state storage media (e.g., solid state drives and/or removable flash memory), optical storage media (e.g., optical discs), and/or magnetic storage media (e.g., hard disk drives). The aforementioned instructions (e.g., software or computer-readable code) may be stored in any volatile and/or non-volatile memory component of memory 520. The computing device 500 may, in some embodiments, further include input device(s) 550 (e.g., a keyboard, mouse, or touchscreen) and output device(s) 560 (e.g., a display, printer). The aforementioned elements of the computing device 500 may be connected to one another through a bus 530, which represents one or more busses. In some embodiments, the processor(s) 510 of the computing device 500 includes both a CPU and a GPU.

Instructions executable by one or more processors may be stored on a non-transitory computer-readable medium. Therefore, whenever a computer-implemented method is described in this disclosure, this disclosure shall also be understood as describing a non-transitory computer-readable medium storing instructions that, when executed by one or more processors, cause the one or more processors to perform the computer-implemented method. Examples of non-transitory computer-readable medium include RAM, ROM, solid-state storage media (e.g., solid state drives), optical storage media (e.g., optical discs), and magnetic storage media (e.g., hard disk drives). A non-transitory computer-readable medium may be part of the memory of a computer system or separate from any computer system.

It should be appreciated that in the above description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claims require more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those skilled in the art. For example, in the following claims, any of the claimed embodiments can be used in any combination.

Thus, while certain embodiments have been described, those skilled in the art will recognize that other and further modifications may be made thereto without departing from the spirit of the disclosure, and it is intended to claim all such changes and modifications as falling within the scope of the disclosure. For example, functionality may be added or deleted from the block diagrams and operations may be interchanged among functional blocks. Steps may be added or deleted to methods described within the scope of the present disclosure.

The above disclosed subject matter is to be considered illustrative, and not restrictive, and the appended claims are intended to cover all such modifications, enhancements, and other implementations, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

While various implementations of the disclosure have been described, it will be apparent to those of ordinary skill in the art that many more implementations and implementations are possible within the scope of the disclosure. Accordingly, the disclosure is not to be restricted.

What is claimed is:

1. A computer-implemented method for providing a vehicle recommendation to a user, the method comprising:
    obtaining, via one or more processors, characteristic data of a user-defined vehicle based on one or more interactive activities of the user with a first three-dimensional model of a model vehicle, wherein the one or more interactive activities of the user comprises at least altering one or more features of the model vehicle based on interaction with a visual component of the first-three dimensional model of the model vehicle;
    generating, via the one or more processors, a second three-dimensional model of the user-defined vehicle based on the first three-dimensional model of the model vehicle and the characteristic data of the user-defined vehicle, the second three-dimensional model incorporating one of more changes made based on the interaction with the visual component of the first-three dimensional model of the model vehicle;
    obtaining, via the one or more processors, one or more images of the second three-dimensional model of the user-defined vehicle, wherein the one or more images comprise at least one of a front side image, a back side image, a left side image, or a right side image of the second three-dimensional model of the user-defined vehicle;
    generating, via the one or more processors, a selection of one or more pre-stored vehicles based on a comparison between the one or more images of the second three-dimensional model of the user-defined vehicle and pre-stored image data of the one or more pre-stored vehicles other than the user-defined vehicle via a trained machine learning algorithm;
    obtaining, via the one or more processors, user feedback data based on a difference between the selection of the one or more pre-stored vehicles and the one or more images of the second three-dimensional model of the user-defined vehicle, wherein the user feedback data indicates a user's preference of a given pre-stored vehicle of the selection of the one or more pre-stored vehicles;
    generating, via the one or more processors, the vehicle recommendation for the user based on the user feedback data via the trained machine learning algorithm; and
    transmitting, to a device associated with the user, a notification indicative of the vehicle recommendation.

2. The computer-implemented method of claim 1, wherein the one or more images include a vectorized image of a portion of the second three-dimensional model of the user-defined vehicle.

3. The computer-implemented method of claim 1, wherein the one or more features of the model vehicle include one or more exterior features or one or more interior features of the model vehicle.

4. The computer-implemented method of claim 3, wherein the one or more features of the model vehicle include the one or more exterior features of the model vehicle, and wherein the one or more exterior features of the model vehicle include at least one of a wheel feature, a color feature, or a shape feature of the model vehicle.

5. The computer-implemented method of claim 3, wherein the one or more features of the model vehicle include the one or more interior features of the model vehicle, and wherein the one or more interior features of the model vehicle include at least one of a material feature, an internal shape feature, an electronics feature, an engine feature, or an add-on feature of the model vehicle.

6. The computer-implemented method of claim 1, wherein the trained machine learning algorithm includes a neural network.

7. The computer-implemented method of claim 1, wherein the selection of the one or more pre-stored vehicles includes a rank of the pre-stored vehicles based on a level of similarity between the pre-stored vehicles and the user-defined vehicle.

8. The computer-implemented method of claim 1, wherein the pre-stored image data of the one or more pre-stored vehicles includes one or more pre-stored images of the one or more pre-stored vehicles.

9. The computer-implemented method of claim 1, wherein the vehicle recommendation includes a recommended vehicle available for purchase.

10. A computer-implemented method for providing a vehicle recommendation to a user, the method comprising:
    obtaining, via one or more processors, a first three-dimensional model of a model vehicle based on automotive data provided by the user, wherein the automotive data comprises at least one of a make or model of the model vehicle;
    obtaining, via the one or more processors, characteristic data of a user-defined vehicle based on one or more interactive activities of the user with the model vehicle, wherein the one or more interactive activities of the user comprise at least altering one or more features of the model vehicle based on interaction with a visual component of the first three-dimensional model of the model vehicle;
    generating, via the one or more processors, a second three-dimensional model of the user-defined vehicle based on the first three-dimensional model of the model vehicle and the characteristic data of the user-defined vehicle, the second three-dimensional model incorporating one or more changes made based on the interaction with the visual component of the first-three dimensional model of the model vehicle;
    obtaining, via the one or more processors, one or more images of the second three-dimensional model of the user-defined vehicle, wherein the one or more images comprise at least one of a front side image, a back side image, a left side image, or a right side image of the second three-dimensional model of the user-defined vehicle;
    obtaining, via the one or more processors, pre-stored image data of one or more pre-stored vehicles other than the user-defined vehicle based on the one or more images of the second three-dimensional model of the user-defined vehicle, wherein the pre-stored image data of the one or more pre-stored vehicles comprises one or more pre-stored images of the one or more pre-stored vehicles;
    generating, via the one or more processors, a selection of the one or more pre-stored vehicles based on the one or more images of the second three-dimensional model of the user-defined vehicle and the pre-stored image data of the one or more pre-stored vehicles other than the user-defined vehicle via a trained machine learning algorithm;

obtaining, via the one or more processors, user feedback data based on a difference between the selection of the one or more pre-stored vehicles and the one or more images of the second three-dimensional model of the user-defined vehicle, wherein the user feedback data indicates a user's preference of a given pre-stored vehicle of the selection of the one or more pre-stored vehicles;

generating, via the one or more processors, the vehicle recommendation for the user based on the user feedback data via the trained machine learning algorithm; and transmitting, to a device associated with the user, a notification indicative of the vehicle recommendation.

11. The computer-implemented method of claim 10, wherein the one or more images include a vectorized image of a portion of the second three-dimensional model of the user-defined vehicle.

12. The computer-implemented method of claim 10, wherein the one or more features of the model vehicle include one or more exterior features or one or more interior features of the model vehicle.

13. The computer-implemented method of claim 12, wherein the one or more features of the model vehicle include the one or more exterior features of the model vehicle, and wherein the one or more exterior features of the model vehicle include at least one of a wheel feature, a color feature, or a shape feature of the model vehicle.

14. The computer-implemented method of claim 12, wherein the one or more features of the model vehicle include the one or more interior features of the model vehicle, and wherein the one or more interior features of the model vehicle include at least one of a material feature, an internal shape feature, an electronics feature, an engine feature, or an add-on feature of the model vehicle.

15. The computer-implemented method of claim 10, wherein the trained machine learning algorithm includes a neural network.

16. The computer-implemented method of claim 10, wherein the selection of the one or more pre-stored vehicles includes a rank of the pre-stored vehicles based on a level of similarity between the pre-stored vehicles and the user-defined vehicle.

17. The computer-implemented method of claim 10, wherein the vehicle recommendation includes a recommended vehicle available for purchase.

18. The computer-implemented method of claim 17, wherein the recommended vehicle is one of the one or more pre-stored vehicles.

19. The computer-implemented method of claim 10, wherein the automotive data is provided by the user via the device associated with the user.

20. A computer system for providing a vehicle recommendation to a user, comprising:
a memory storing instructions; and
one or more processors configured to execute the instructions to perform operations including:
obtaining characteristic data of a user-defined vehicle based on one or more interactive activities of the user with a first three-dimensional model of a model vehicle, wherein the one or more interactive activities of the user comprise at least altering one or more features of the model vehicle based on interaction with a visual component of the first-three dimensional model of the model vehicle;
generating a second three-dimensional model of the user-defined vehicle based on the first three-dimensional model of the model vehicle and the characteristic data of the user-defined vehicle, the second three-dimensional model incorporating one or more changes made based on the interaction with the visual component of the first-three dimensional model of the model vehicle;
obtaining one or more images of the second three-dimensional model of the user-defined vehicle, wherein the one or more images comprise at least one of a front side image, a back side image, a left side image, or a right side image of the second three-dimensional model of the user-defined vehicle;
generating a selection of one or more pre-stored vehicles based on a comparison between the one or more images of the second three-dimensional model of the user-defined vehicle and pre-stored image data of the one or more pre-stored vehicles other than the user-defined vehicle via a trained machine learning algorithm;
obtaining user feedback data based on a difference between the selection of the one or more pre-stored vehicles and the one or more images of the second three-dimensional model of the user-defined vehicle, wherein the user feedback data indicates a user's preference of a given pre-stored vehicle of the selection of the one or more pre-stored vehicles;
generating the vehicle recommendation for the user based on the user feedback data via the trained machine learning algorithm; and
transmitting, to a device associated with the user, a notification indicative of the vehicle recommendation.

* * * * *